(12) United States Patent
Kim

(10) Patent No.: US 8,705,687 B2
(45) Date of Patent: Apr. 22, 2014

(54) INPUT CIRCUIT IN HIGH SPEED COUNTER MODULE IN PLC

(71) Applicant: LSIS Co., Ltd., Anyang-si (KR)

(72) Inventor: Seok Yeon Kim, Gangneung-si (KR)

(73) Assignee: LSIS Co., Ltd., Anyang-Si, Gyeonggi-Do (KR)

( * ) Notice: Subject to any disclaimer, the term of this patent is extended or adjusted under 35 U.S.C. 154(b) by 29 days.

(21) Appl. No.: 13/679,786

(22) Filed: Nov. 16, 2012

(65) Prior Publication Data

US 2013/0142302 A1    Jun. 6, 2013

(30) Foreign Application Priority Data

Nov. 25, 2011    (KR) ................ 10-2011-0124308

(51) Int. Cl.
*G06M 3/00*    (2006.01)
*H03K 21/02*    (2006.01)

(52) U.S. Cl.
USPC ............................. 377/55; 377/111

(58) Field of Classification Search
None
See application file for complete search history.

(56) References Cited

U.S. PATENT DOCUMENTS

| 4,330,751 | A | * | 5/1982 | Swain .......................... 327/114 |
| 4,924,484 | A | * | 5/1990 | Grasso et al. ................. 377/116 |
| 5,063,580 | A | * | 11/1991 | Canfield et al. .............. 377/55 |
| 6,097,781 | A | * | 8/2000 | Wright et al. ................ 377/26 |
| 2008/0037698 | A1 | * | 2/2008 | Park et al. ................... 377/55 |

* cited by examiner

*Primary Examiner* — Tuan T Lam
(74) *Attorney, Agent, or Firm* — Lee, Hong, Degerman, Kang & Waimey

(57) ABSTRACT

An input circuit in high speed counter module for PLC is provided, the input circuit being configured such that various types of pulse signals are changed to a single type of pulse signal and transmitted to an MPU, whereby the type of input pulse is checked or an operation of checking addition/deduction is omitted to increase an interrupt process speed.

11 Claims, 19 Drawing Sheets

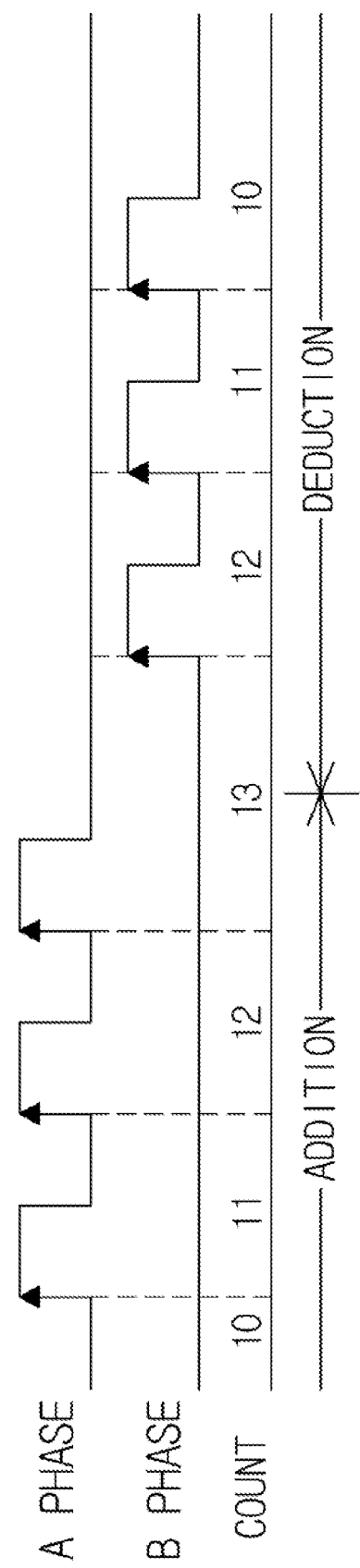

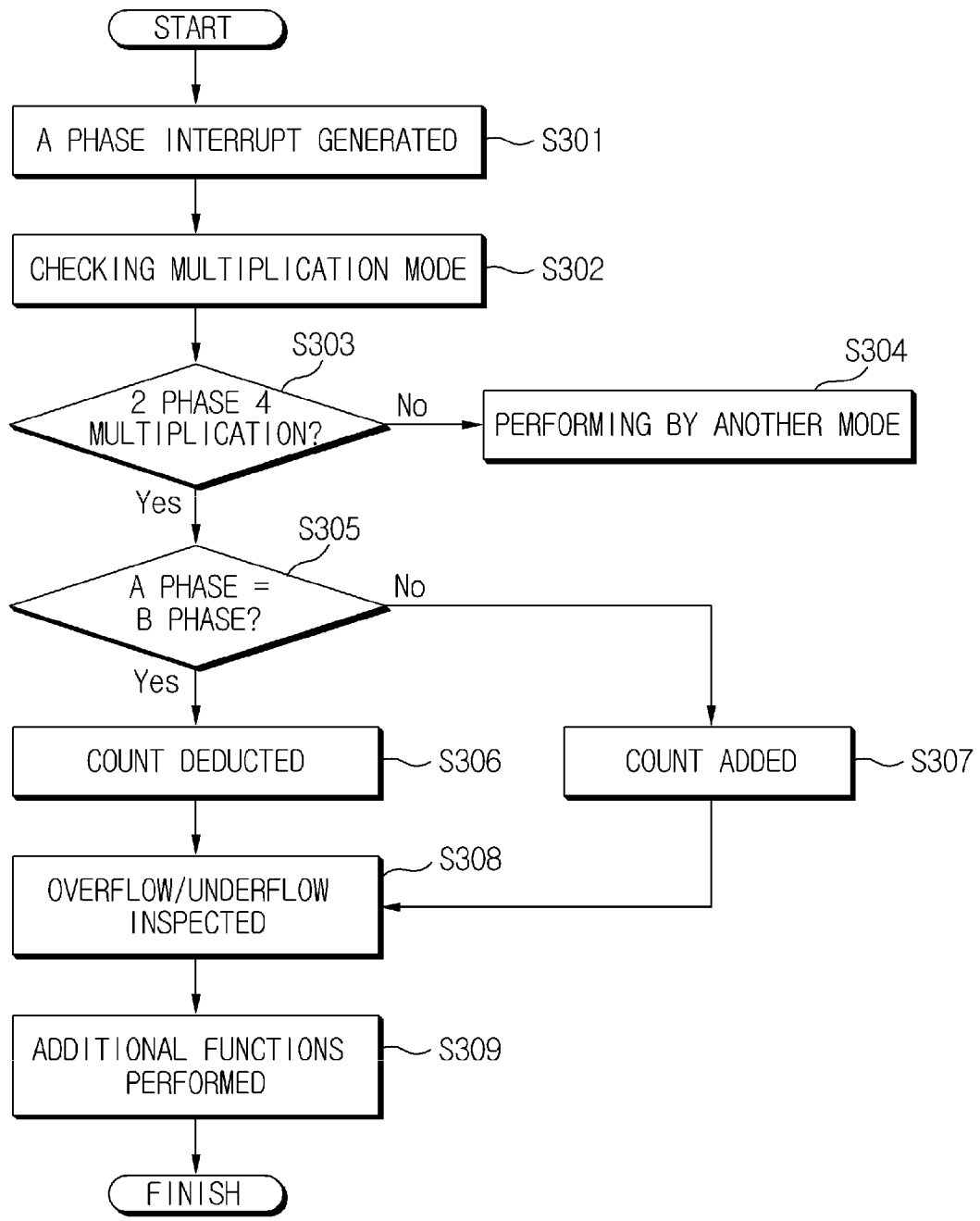

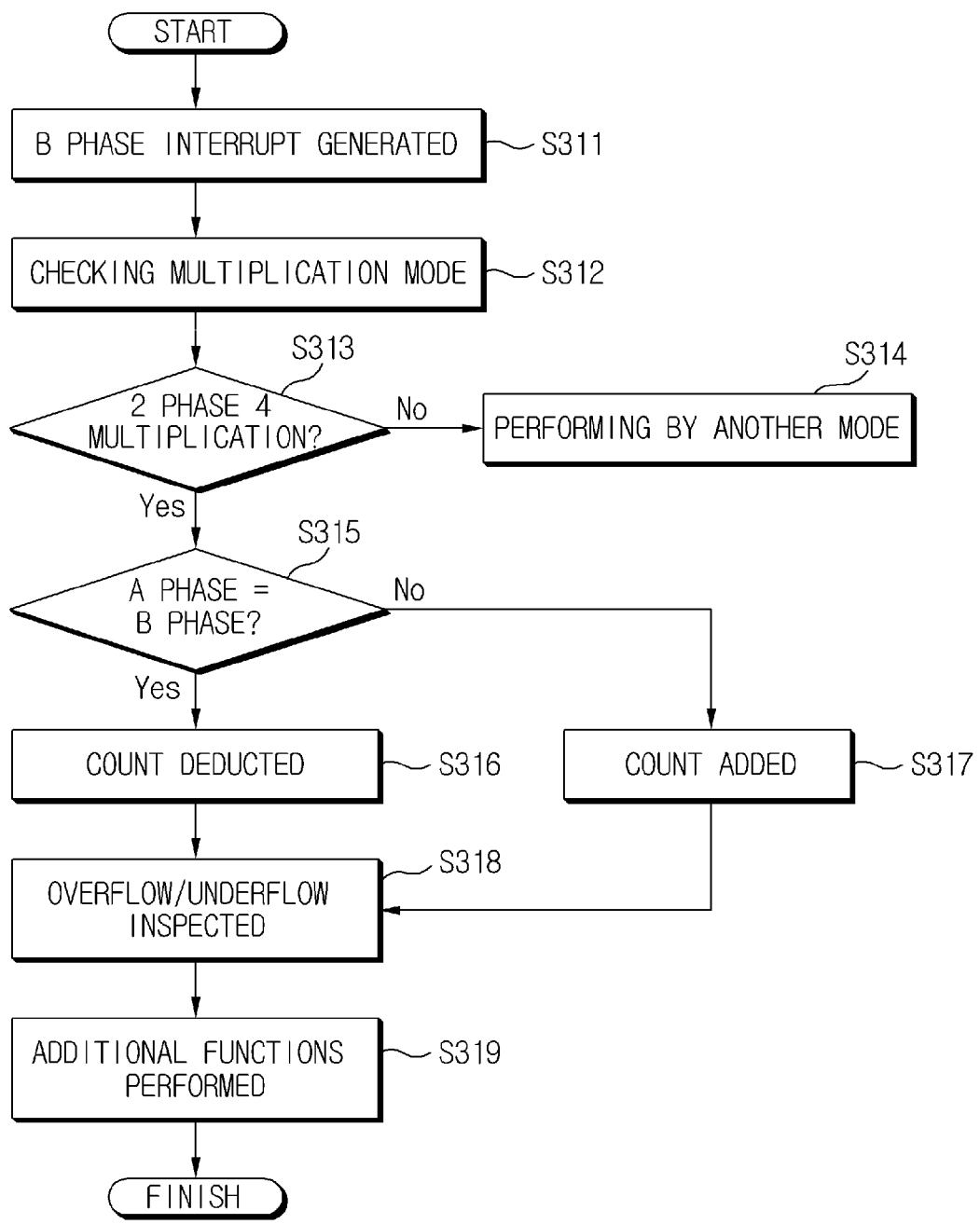

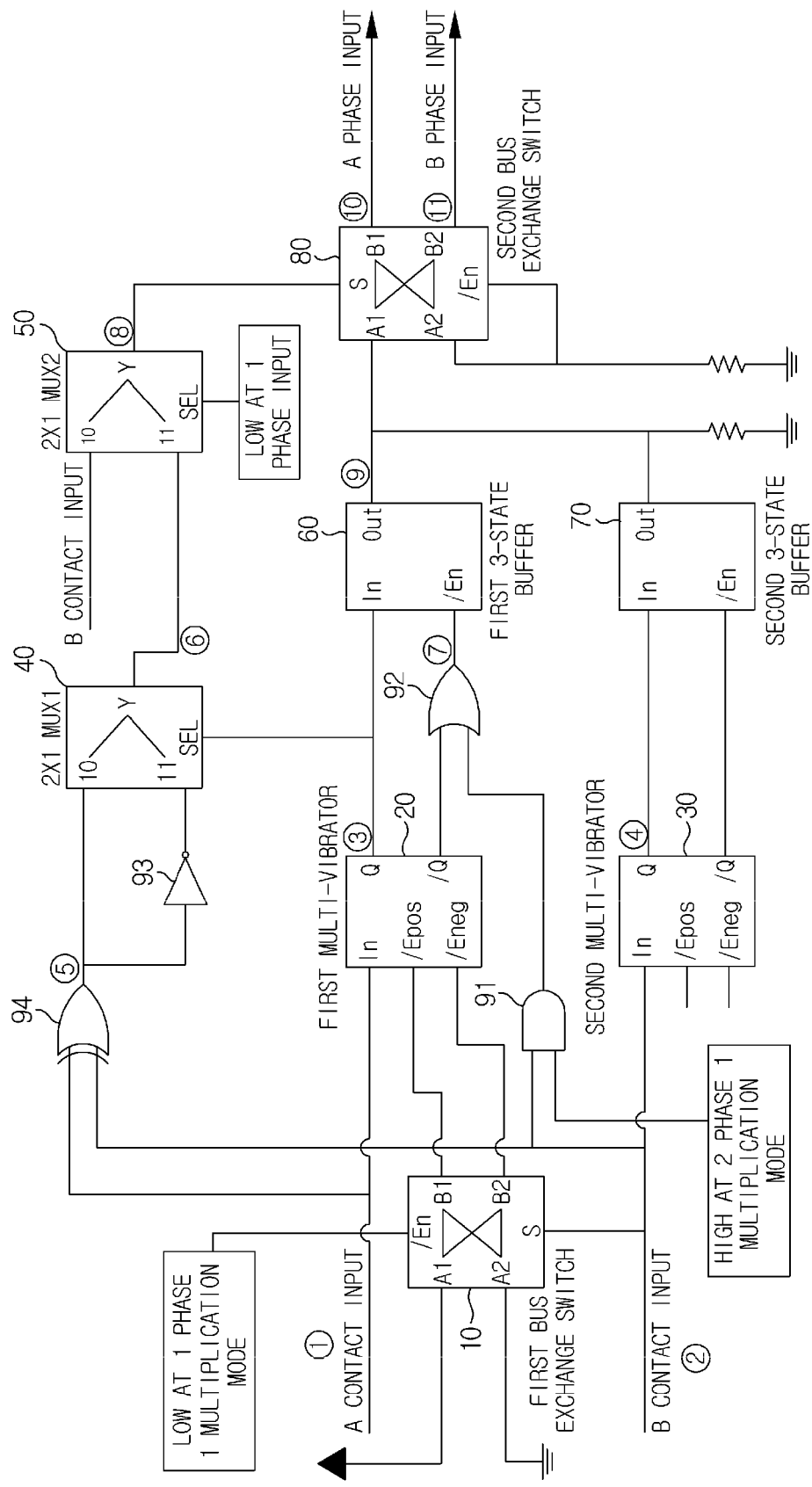

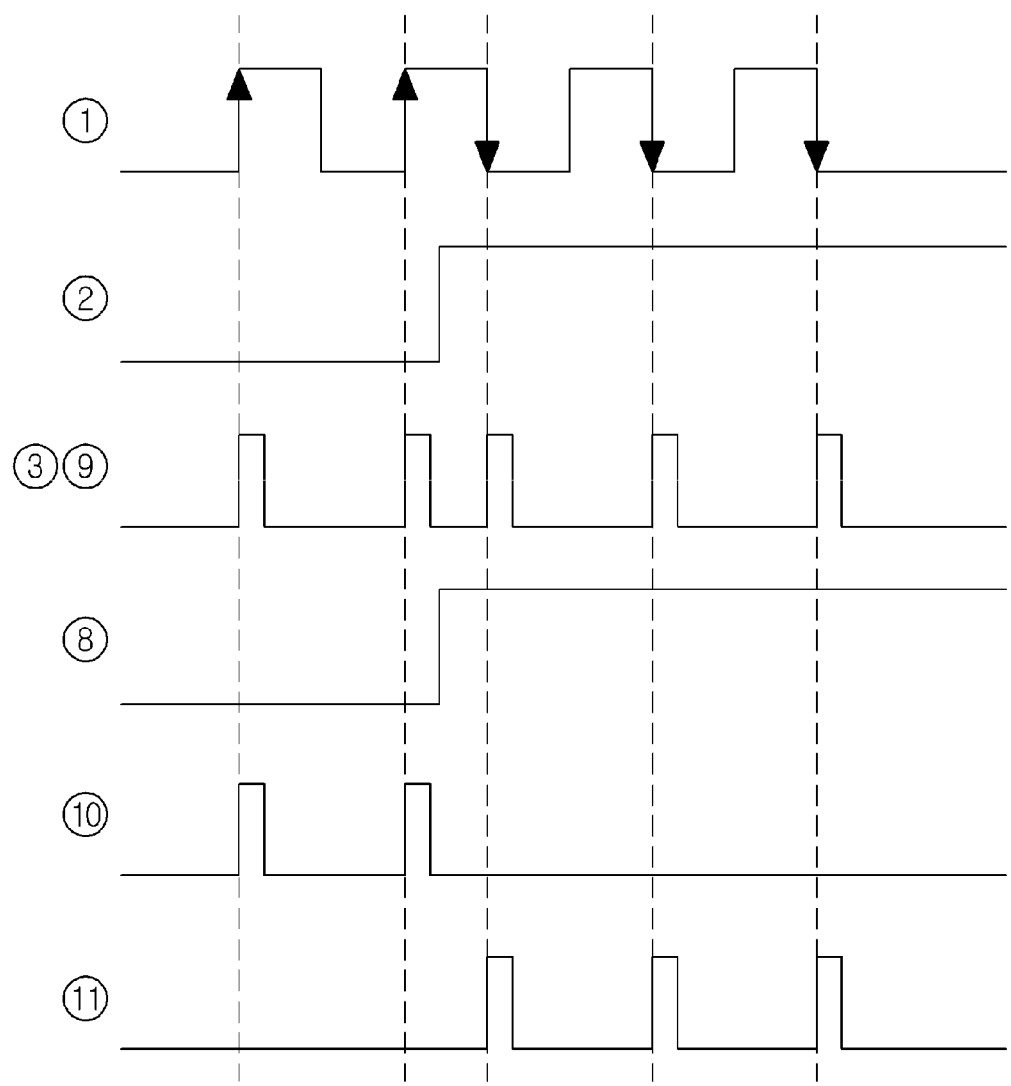

INPUT CIRCUIT IN HIGH SPEED COUNTER MODULE IN PLC

Pursuant to 35 U.S.C. §119 (a), this application claims the benefit of earlier filing date and right of priority to Korean Patent Application No. 10-2011-0124308, filed on Nov. 25, 2011, the contents of which are hereby incorporated by reference in their entirety.

BACKGROUND OF THE DISCLOSURE

1. Field of the Disclosure

The present disclosure relates to an input circuit, and more particularly to an input circuit configured for use in a high speed counter module, one of extension modules of Programmable Logic Controller (PLC).

2. Discussion of the Related Art

The information disclosed in this Discussion of the Related Art section is only for enhancement of understanding of the general background of the present disclosure and should not be taken as an acknowledgement or any form of suggestion that this information forms the prior art already known to a person skilled in the art.

Generally, a high speed counter module of Programmable Logic Controller (PLC) functions to count a fast pulse signal of a pulse generator or an encoder, and is defined by an extension module for PLC necessary for performing an operation where revolution of a motor is learned at an industrial site.

The high speed counter module uses a high speed pulse to enhance accuracy of pulse counting function, and a conventional high speed counter module uses a Micro Processor Unit (MPU) to count various input signals via interrupt.

However, the MPU using interrupt suffers from a disadvantage in counting high speed pulses that many conditions are required.

FIG. 1 is a schematic view illustrating a pulse input method of a high speed counter module of PLC according to prior art, and FIGS. 2A, 2B, and 2C are schematic views illustrating a counting method of a pulse input module of FIG. 1, where FIG. 2A illustrates 1-phase/2-input/1-multiplication mode, FIG. 2B illustrates 2-phase/4-multiplication mode, and FIG. 2C illustrates clockwise (CW)/counterclockwise (CCW) counting mode.

Referring to FIG. 1, FIG. 2A, FIG. 2B, and FIG. 2C, an encoder (100) generally outputs a 1-phase pulse or a 2-phase pulse, and an MPU (200) of PLC receives a rising edge or a falling edge of the pulse via an interrupt to count the pulses. The MPU (200) generally counts pulses via 1-phase/2-input/1-multiplication mode, 1-phase/2-input/2-multiplication mode, 2-phase/1-multiplication mode, 2-phase/2-multiplication mode, 2-phase/4-multiplication mode, or CW/CCW mode, where a type of counting and states of adding/deducting are checked to perform the addition/deduction operations. In the conventional counting method, the rising edge/falling edge are detected and all the counting operations must be completed before detection of next edges.

A phase in FIG. 2A (1-phase/2-input/1-multiplication mode) is a pulse to be counted, and B phase is addition/deduction state. FIG. 2B (2-phase/4-multiplication mode) shows a state in which the A phase is compared with the B phase, and if phase of the A phase is ahead, addition is made and if phase of the A phase is behind, deduction is made. FIG. 2C (CW/CCW) shows a state in which input of the A phase is added, while input of the B phase is deducted.

As noted from the foregoing, the MPU (200) detects rising edge/falling edge of interrupt connected to the pulse input to process a service routine of the interrupt. FIG. 3A and FIG. 3B are flowcharts illustrating interrupt process routine of a conventional MPU in 2-phase/4-multiplication mode, where FIG. 3A illustrates an A phase interrupt routine, and FIG. 3B illustrates a B phase interrupt routine.

In a case A phase and B phase interrupt process routines are started (S301, S311), a multiplication mode is first checked (S302, S312). The multiplication mode includes, as explained above, 1-phase/2-input/1-multiplication mode, 1-phase/2-input/2-multiplication mode, 2-phase/1-multiplication mode, 2-phase/2-multiplication mode, 2-phase/4-multiplication mode and CW/CCW mode, where methods of classifying addition and deduction for each mode are different, and other modes are performed in case of the multiplication mode not being the 2-phase/4-multiplication mode (S304, 314).

In case of the multiplication mode being 2-phase/4-multiplication mode (S303, S313), the A phase interrupt routine (FIG. 3A) performs addition in case of A phase and B phase being different, and performs deduction in case of A phase and B phase being identical (S305. S307), and alternatively B phase interrupt routine performs the addition/deduction (S315 to S317). In the same manner, addition/deduction is classified in 2-phase/1-multiplication mode and 2-phase/2-multiplication mode. After addition/deduction, over/under flows are checked (S308, 5318) and additional function is finally performed (A309, S319).

FIG. 4 is a flowchart illustrating an interrupt process routine of a conventional MPU in 1-phase/2-input/1-multiplication mode.

In a case the interrupt process routine is started (S401), a multiplication mode is first checked (S402). In case of 1-phase/2-input/1-multiplication mode (S403), addition/deduction is classified through B phase level. 1-phase/2-input/2-multiplication mode is also classified in the same manner. That is, in case of B phase being LOW (S405), addition is performed at a rising edge of A phase (S406, S407), and deduction is performed (S408, 5409) at a falling edge of A phase in case of B phase being HIGH (S405). The addition/deduction is not performed when B phase is HIGH at a rising edge of A phase, and when B phase is LOW at a falling edge of A phase.

As noted from the foregoing, the high speed counter module for PLC according to prior art is such that an operation mode is first classified during pulse input, and counting operation is performed after grasp of addition/deduction states. There are various input modes, and differently processes in response to operation edges of each mode. The process routine must be completely finished, at least before a next pulse is inputted. The MPU (200) must perform other functions than the high speed counting, such that the interrupt routine counting pulses needs to be shortened to the maximum.

FIG. 5 is a schematic view illustrating a problem encountered during interrupt process routine of MPU at 2-phase/4-multiplication mode, where a problem occurs in which as the frequency of input pulse increases, a next pulse is inputted before the interrupt routine is processed. As noted above, in a case an interrupt period is equal to or shorter than an interrupt routine process time, the MPU (200) disadvantageously performs a high speed count only, or performs an erroneous operation by omitting an input pulse.

SUMMARY OF THE DISCLOSURE

This section provides a general summary of the disclosure, and is not a comprehensive disclosure of its full scope or all of its features.

Exemplary aspects of the present disclosure are to substantially solve at least the above problems and/or disadvantages and to provide at least the advantages below.

Accordingly, an aspect of the present disclosure provides an input circuit in high speed counter module for PLC configured such that various types of pulse signals are changed to a single type of pulse signal and transmitted to an MPU, whereby the mode of input pulse is checked or an operation of checking addition/deduction is omitted to increase an interrupt process speed.

It should be emphasized, however, that the present disclosure is not limited to a particular disclosure, as explained above. It should be understood that other technical subjects not mentioned herein may be appreciated by those skilled in the art.

In one general aspect of the present disclosure, there is provided an input circuit in high speed counter module for PLC configured to input a pulse to an MPU, the input circuit comprising: a first multi-vibrator generating a pulse by detecting rising/falling edges of a first contact input; a second multi-vibrator generating a pulse by detecting rising/falling edges of a second contact input; a first buffer outputting an output of the first multi-vibrator in 3-state; a second buffer outputting an output of the second multi-vibrator in 3-state; a first multiplexer (MUX) outputting any one of an EX-OR signal of the first and second contact inputs and a reverse signal of the EX-OR signal; a second MUX outputting any one of an output of the first MUX and the second contact input; and a first switch outputting outputs of the first and second buffers as a first phase input or a second phase input.

In some exemplary embodiments, the first and second contact inputs are any one signal of a 1-phase/2-input/1-multiplication mode, a 1-phase/2-input/2-multiplication mode, a 2-phase/1-multiplication mode, a 2-phase/2-multiplication mode, a 2-phase/4-multiplication mode, and a CW/CCW mode.

In some exemplary embodiments, the input circuit may further comprise a second switch that switches by receiving LOW and HIGH signals.

In some exemplary embodiments, the second switch may receive the second contact input as a selection signal, and receives a 'LOW at a 1-phase/1-multiplication' as a control signal.

In some exemplary embodiments, the first multi-vibrator may receive an output of the second switch as a control signal.

In some exemplary embodiments, the first and second multi-vibrators may receive a control signal from the MPU.

In some exemplary embodiments, the first buffer may receive ORs (logical sums) of the first and second outputs as a control signal where the first output may be AND (logical product) of the second contact input and a 'HIGH at 2-phase/1-multiplication' and the second output may be a reversal of an output of the first multi-vibrator.

In some exemplary embodiments, the second buffer may receive a reversal of an output of the second multi-vibrator as a control signal.

In some exemplary embodiments, the first MUX may receive an output of the first multi-vibrator as a control signal.

In some exemplary embodiments, the second MUX may receive 'LOW at 1-phase input' as a control signal.

In some exemplary embodiments, the first switch may receive an output of the second MUX as a selection signal.

The input circuit in high speed counter module for PLC according to the present disclosure has an advantageous effect in that an input signal is simplified into CW/CCW mode to free from requirement of check of multiplication mode and addition/deduction state at an interrupt routine of firmware, whereby interrupt process speed can be enhanced.

Another advantageous effect is that a small-sized PLC can be greatly reduced in performing other functions through improvement of interrupt process speed of a pulse signal of the present disclosure, in view of the fact that the small-sized PLC must perform other functions than a high speed counting function.

Other exemplary aspects, advantages, and salient features of the disclosure will become more apparent to persons of ordinary skill in the art from the following detailed description, which, taken in conjunction with the annexed drawings, discloses exemplary embodiments of the invention.

The above and other features of the invention are discussed infra.

BRIEF DESCRIPTION OF THE DRAWINGS

The above and other features of the present invention will now be described in detail with reference to certain exemplary embodiments thereof illustrated in the accompanying drawings which are given hereinafter by way of illustration only, and thus are not limitative of the present invention, and wherein:

FIGS. 2A-2C are schematic views illustrating a counting method of a pulse input module of FIG. 1;

FIG. 3A and FIG. 3B are flowcharts illustrating interrupt process routine of a conventional MPU in 2-phase/4-multiplication mode;

FIG. 6 is a configurative block diagram illustrating an input circuit in high speed counter module for PLC according to an exemplary embodiment of the present disclosure;

FIG. 7B is a timing view of each point of FIG. 7A according to an exemplary embodiment of the present disclosure;

Figure 1:
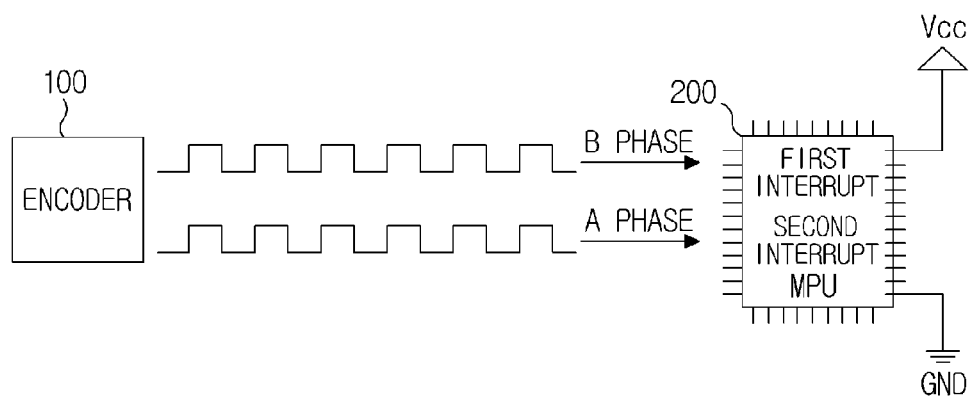
FIG. 1 is a schematic view illustrating a pulse input method of a high speed counter module of PLC according to prior art.
Figure 2A:
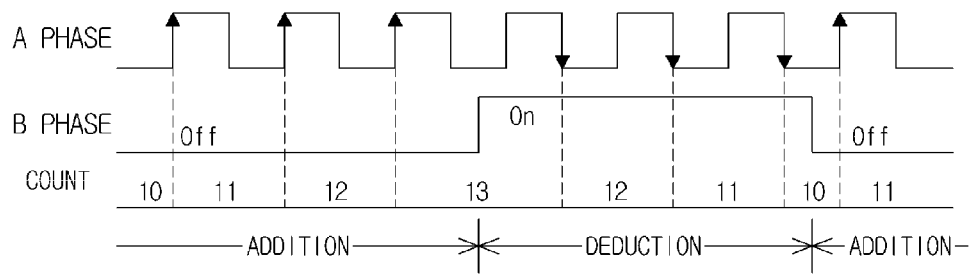
Figure 2B:
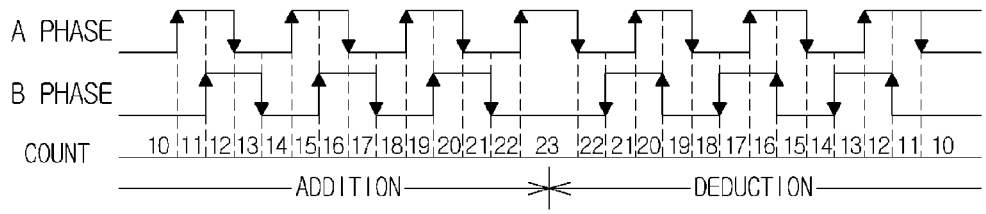
Figure 4:
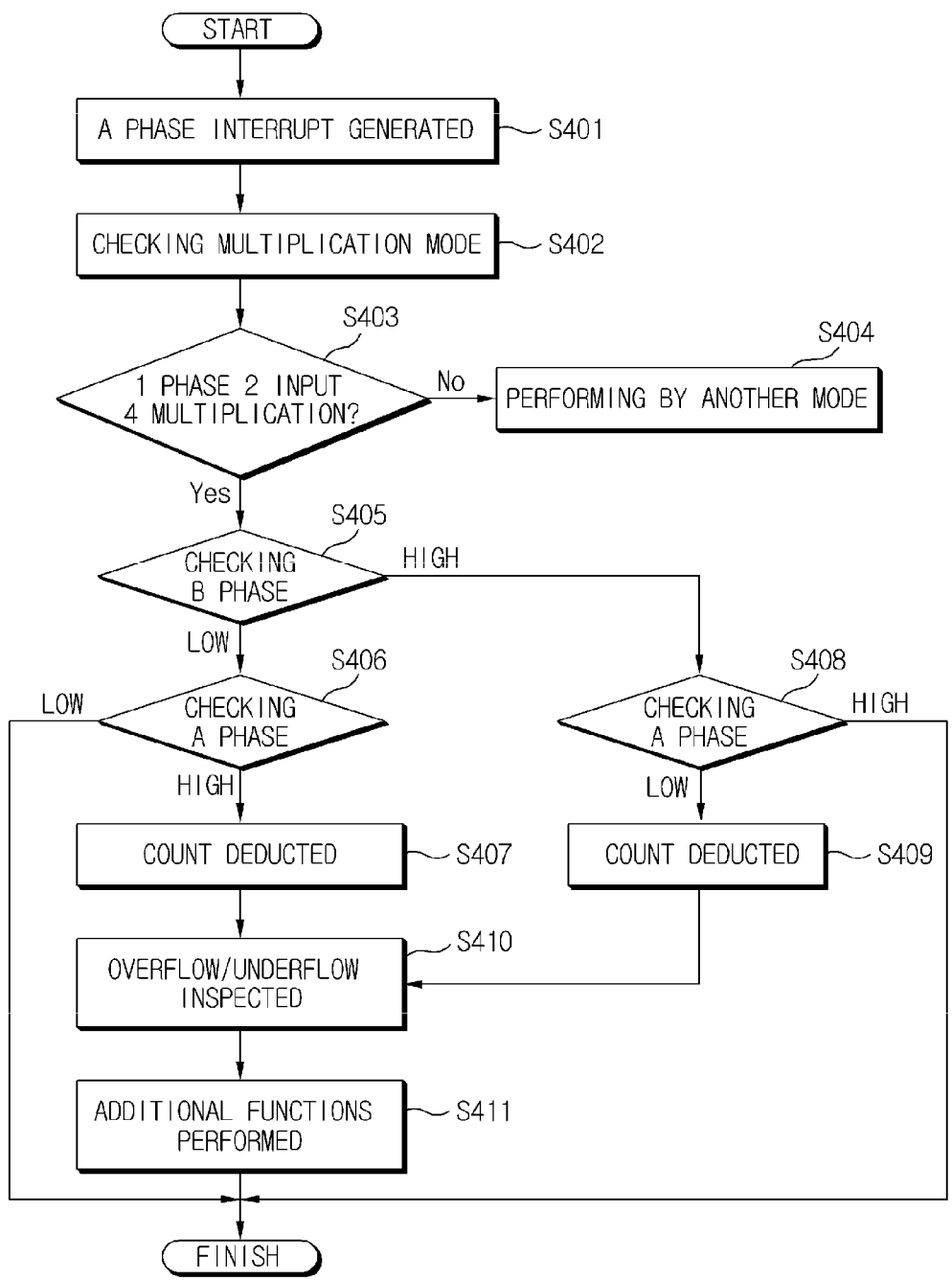
FIG. 4 is a flowchart illustrating an interrupt process routine of a conventional MPU in 1-phase/2-input/1-multiplication mode.
Figure 5:
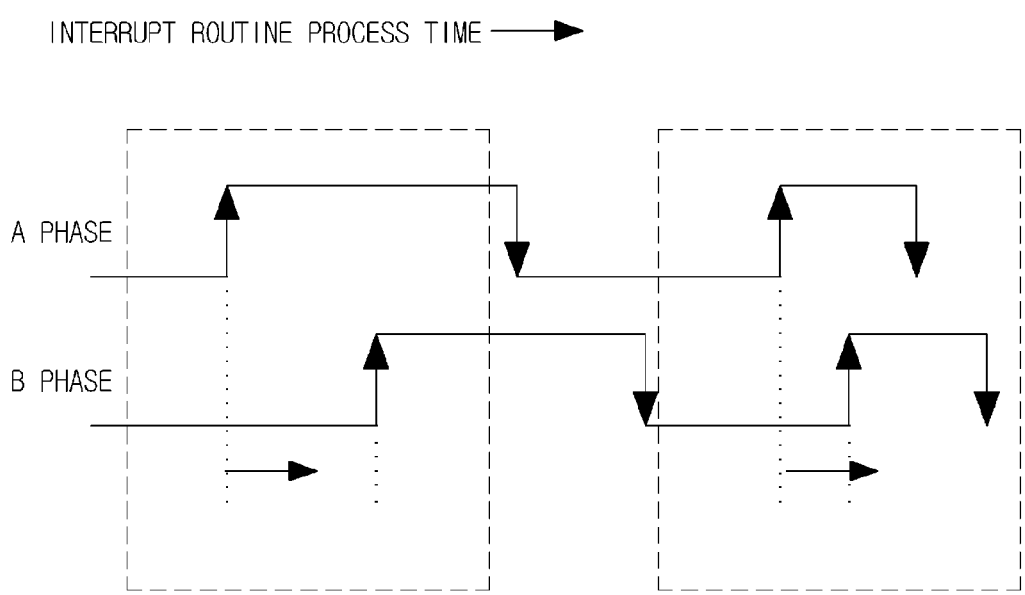
FIG. 5 is a schematic view illustrating a problem encountered during interrupt process routine of MPU at 2-phase/4-multiplication mode.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

It is to be understood that both the foregoing general description and the following detailed description of the present disclosure are exemplary and explanatory and are intended to provide further explanation of the disclosure as claimed.

DETAILED DESCRIPTION

In describing the present disclosure, detailed descriptions of constructions or processes known in the art may be omitted to avoid obscuring appreciation of the invention by a person of ordinary skill in the art with unnecessary detail regarding such known constructions and functions. Accordingly, the meaning of specific terms or words used in the specification and claims should not be limited to the literal or commonly employed sense, but should be construed or may be different in accordance with the intention of a user or an operator and customary usages. Therefore, the definition of the specific terms or words should be based on the contents across the specification.

The suffixes 'module', 'unit' and 'part' may be used for elements in order to facilitate the disclosure. Significant meanings or roles may not be given to the suffixes themselves and it is understood that the 'module', 'unit' and 'part' may be used together or interchangeably. That is, the terms "-er", "-or", "part" and "module" described in the specification mean units for processing at least one function and operation and can be implemented by hardware components or software components, and combinations thereof.

As used herein, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated. That is, in the drawings, the size and relative sizes of layers, regions and/or other elements may be exaggerated or reduced for clarity. Like numbers refer to like elements throughout and explanations that duplicate one another will be omitted.

It will be understood that, although the terms first, second, etc. may be used herein to describe various elements, these elements should not be limited by these terms. These terms are only used to distinguish one element from another. For example, a first region/layer could be termed a second region/layer, and, similarly, a second region/layer could be termed a first region/layer without departing from the teachings of the disclosure.

The terminology used herein is for the purpose of describing particular embodiments only and is not intended to be limiting of the general inventive concept. As used herein, the singular forms "a", "an" and "the" are intended to include the plural forms as well, unless the context clearly indicates otherwise.

The MPU performs an addition is such that an A phase input performs an addition and a B phase input performs deduction at CW/CCW mode, whereby a routine classifying addition/deduction is omitted to simplify operations over other multiplication modes. The present disclosure takes note of this advantage to change several multiplication modes to a CW/CCW mode.

Hereinafter, exemplary embodiments of the present disclosure will be described in detail with reference to the accompanying drawings.

Now, FIG. 6 is a configurative block diagram illustrating an input circuit in high speed counter module for PLC according to an exemplary embodiment of the present disclosure.

The present disclosure dispenses with a method of directly transmitting a conventional input pulse to the MPU (200), and instead changes the conventional input pulse to a pulse of easily countable CW/CCW mode using digital circuits including multi-vibrators and transmits the input pulse to an MPU (not shown).

In FIG. 6, an A contact input and a B contact input are signals before digital conversion by the input circuit of the present disclosure, while an A phase input and a B phase input are signals after digital conversion by the input circuit of the present disclosure.

In the present disclosure, various input signals are all converted to CW/CCW modes after digital conversion to be provided to the MPU as shown in FIG. 1, where the MPU can perform addition/deduction without conditional sentences (addition for A phase input, deduction for B phase input) to enable a faster task conversion over a conventional system.

Referring to FIG. 6, a pulse input circuit according to the present disclosure comprises a first bus exchange switch (10), a first multi-vibrator (20), a second multi-vibrator (30), a first multiplexer (MUX, 40), a second MUX (50), a first 3-state buffer (60), a second 3-state buffer (70) and a second bus exchange switch (80).

The first and second bus exchange switches (10, 80) switch two inputs in response to a control signal of a /En terminal and a selection signal of an S terminal, and output the switched inputs. To be more specific, the first and second bus exchange switches (10, 80) may receive inputs at A1 and A2 terminals and outputs by connecting to B1 and B2 terminals (A1→B1, A2→B2), or by connecting to the B2 and B1 terminals (A1→B2, A2→B1), where input and output of the first and second bus exchange switches (10, 80) are provided as under in Table 1.

TABLE 1

| Control signal /En terminal | Selection signal S terminal | input-output |
|---|---|---|
| LOW | LOW | A1-B1, A2-B2 |
| LOW | HIGH | A1-B2, A2-B1 |
| HIGH | — | HI-Z |

The first and second multi-vibrators (20, 30) serve to generate a short pulse by detecting rising/falling edges of the input signal, where the pulse may be preferably set at 10 ns to 10 ms or more. Selectively, the first and second multi-vibrators (20, 30) may generate pulses at all the rising and falling edges in response to a control signal inputted to a /Epos and a /Eneg terminals, or generate only a pulse at a rising edge or only a pulse at a falling edge, where input and output of the first and second multi-vibrators (20, 30) are provided as under in Table 2.

TABLE 2

| Input | | Output |
|---|---|---|
| /Epos terminal | /Eneg terminal | |
| LOW | LOW | Pulse outputted at input of rising and falling edges |
| LOW | HIGH | Pulse outputted at input of rising edge |
| HIGH | LOW | Pulse outputted at input of falling edge |
| HIGH | HIGH | No pulse output |

The first and second MUXs (40, 50) of 2×1 selects one of two inputs in response to a control signal inputted to a SEL terminal and outputs the one input. Input and output of the first and second MUXs (40, 50) of 2×1 are shown in Table 3 as below.

TABLE 3

| Input | | | Output |
|---|---|---|---|
| SEL terminal | I1 terminal | I0 terminal | Y terminal |
| LOW | — | LOW | LOW |
| LOW | — | HIGH | HIGH |
| HIGH | LOW | — | LOW |
| HIGH | HIGH | — | HIGH |

The first and second 3-state buffers (60, 70) are one of logic elements having three output states, where LOW, HIGH and HI-Z (High impedance) are outputted by a control signal inputted to a /En terminal Input and output of the first and second 3-state buffers (60, 70) are as shown below in Table 4.

TABLE 4

| Control signal(/En terminal) | Input | Output |
|---|---|---|
| LOW | LOW | LOW |
| LOW | HIGH | HIGH |
| HIGH | — | HI-Z |

Meanwhile, the pulse input circuit of FIG. 6 includes, in addition to the above-mentioned elements, a logical product (AND) gate (91), a logical sum (OR) gate (92), a NOT-gate (93) and an exclusive-OR (EX-OR) gate (94).

Input and output of AND gate (91) are as below in Table 5.

TABLE 5

| Input | | Output |
|---|---|---|
| A | B | Y |
| LOW | LOW | LOW |
| LOW | HIGH | LOW |
| HIGH | LOW | LOW |
| HIGH | HIGH | HIGH |

Input and output of OR gate (92) are as below in Table 6.

TABLE 6

| Input | | Output |
|---|---|---|
| A | B | Y |
| LOW | LOW | LOW |
| LOW | HIGH | HIGH |
| HIGH | LOW | HIGH |
| HIGH | HIGH | HIGH |

Input and output of NOT gate (93) are as under in Table 7.

TABLE 7

| Input | Output |
|---|---|
| LOW | HIGH |
| HIGH | LOW |

Furthermore, the EX-OR gate (94) is a logical element outputting 1 when not mutually equal, input and output of which are as below in Table 8.

TABLE 8

| Input | | Output |
|---|---|---|
| A | B | Y |
| LOW | LOW | LOW |
| LOW | HIGH | HIGH |
| HIGH | LOW | HIGH |
| HIGH | HIGH | LOW |

The input circuit thus described transforms all types of input pulses to CW/CCW mode. In CW/CCW mode, A phase input means counter addition, while the B phase input means counter deduction, such that in FIG. 3A, steps of S302 to S306 may be omitted, and in FIG. 3B, steps of S312 to S315, S317 may be omitted.

Now, a connection state of input circuit of FIG. 6 will be described. The first bus exchange switch (10) switches a HIGH input inputted to the A1 terminal and a LOW input inputted to the A2 terminal using a control signal and a selection signal inputted to the /En and S terminals, and outputs same. The control signal inputted to the /En terminal of the first bus exchange switch (10) is a LOW signal in case of 1-phase/1-multiplication mode, and the selection signal inputted to the S terminal is the B contact input. Thus, in case of 1-phase/1-multiplication mode, addition/deduction may be differently controlled in response to level of the second contact input.

In order to control a generating condition of pulses, the first multi-vibrator (20) receives signals inputted to the /Epos terminal connected to the B1 terminal of the first exchange switch (10) and the /Eneg terminal connected to the B2 terminal as control signals to generate a short pulse by detecting rising/falling edges of the A contact input. However, although FIG. 6 has illustrated an example where the control signals inputted to the /Epos and /Eneg terminals are outputs of the first bus exchange switch (10), it should be apparent to the skilled in the art that a control signal may be received by the MPU.

The second multi-vibrator (30) generates a short pulse by detecting rising/falling edges of the B contact input by control signals inputted to the /Epos and /Eneg terminals from the MPU.

The first MUX (40) outputs any one, by a control signal inputted to the SEL terminal, of an output of EX-OR gate (94)

relative to the A contact input and the B contact input and an output of NOT gate (93) using the output of the EX-OR gate (94) as an input. Furthermore, the second MUX (50) outputs any one of an output of the first MUX (40) and the B contact input by a control signal inputted to the SEL terminal. The control signal inputted to the SEL terminal of the first MUX (40) is an output of the first multi-vibrator (20), and a control signal inputted to the SEL terminal of the second MUX (50) is a 'LOW in case of 1 phase input'.

The first 3-state buffer (60), using an output of the first multi-vibrator (20) as an input, outputs in a 3-state by the control signal inputted to the /En terminal. The control signal inputted to the /En terminal of the first 3-state buffer (60) is an output of the OR gate (92) where inputs of the OR gate (92) are an output of AND gate (91) using the B contact input and 'HIGH in case of 2 phase 1 multiplication' as inputs and an output from the /Q terminal of the first multi-vibrator (20) (i.e., inversion of output of the Q terminal).

The second 3-state buffer (70) receives an output of the Q terminal of the second multi-vibrator (30) as an input, and outputs in a 3-state using an inversion of output of the Q terminal (output of the /Q terminal) as a control signal of the /En terminal.

The second bus exchange switch (80) receives an output of the first 3-state buffer (60) and an output of the second 3-state buffer (70) as an input signal of the A1 terminal, and uses an output of the second MUX (50) as a selection signal inputted to the S terminal, outputs it by switching to the B1 or B2 terminals.

Although an electrical signal cannot make two different outputs as one signal, it is possible for the first and second 3-state buffers (60, 70) to make two outputs a single signal, because the first and second 3-state buffers (60, 70) are in high impedance state under no output, and there is no instance where two outputs of the first and second 3-state buffers (60, 70) are simultaneously outputted.

The signal outputted from the B1 terminal of the second bus exchange switch (80) is the A phase input of the input circuit of the present disclosure, and the signal outputted from the B2 terminal of the second exchange switch (80) is the B phase input of the input signal of the present disclosure.

Figure 7A:
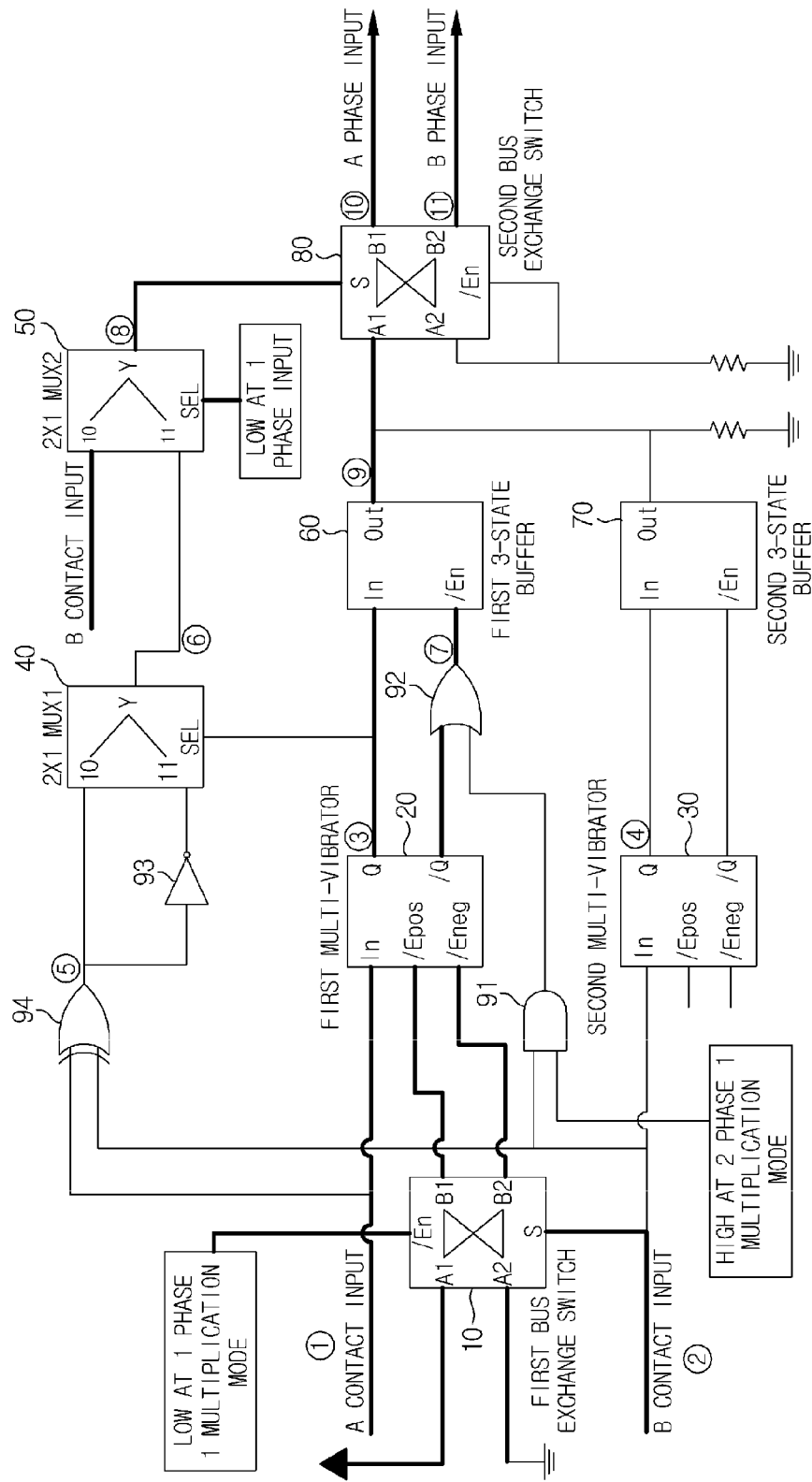
FIG. 7A is a configurative block diagram illustrating an operation of a circuit of FIG. 6 at a multiplication mode of 1-phase/2-input/1-multiplication according to an exemplary embodiment of the present disclosure.

FIG. 7A is a configurative block diagram illustrating an operation of a circuit of FIG. 6 at a multiplication mode of 1-phase/2-input/1-multiplication according to an exemplary embodiment of the present disclosure, and FIG. 7B is a timing view of each point of FIG. 7A according to an exemplary embodiment of the present disclosure, where paths indicated in a thick line illustrate flows in which a signal is inputted and outputted, and same is applied in the following figures.

A control signal inputted to the /Eneg terminal of the first multi-vibrator (20) is same as the B contact input (②), and a control signal inputted to the /Epos terminal is an inversion of the B contact input, such that in a case the B contact input is LOW, a pulse is outputted when the A contact input is at a rising edge, and in a case the B contact input is HIGH, a pulse is outputted when the A contact input is at a falling edge.

The A contact input of ① is converted to pulse of ③ by passing the first multi-vibrator (20). A control signal inputted to the /En terminal of the first 3-state buffer (60) is an output of the /Q terminal of the first multi-vibrator (20), such that the pulse of ③ and pulse of ⑨ are matched.

A selection signal inputted to the S terminal of the second bus exchange switch (80) is the B contact input, such that in a case the B contact input is LOW (pulse of ⑧ being LOW), the pulse of ⑨ is transmitted to the A phase input, and in a case the B contact input is HIGH (pulse of ⑧ being HIGH), the pulse of ⑨ is transmitted to the B phase input.

Thus, it can be noted that a condition of 1-phase/2-input/ 1-multiplication is satisfied.

Figure 8A:
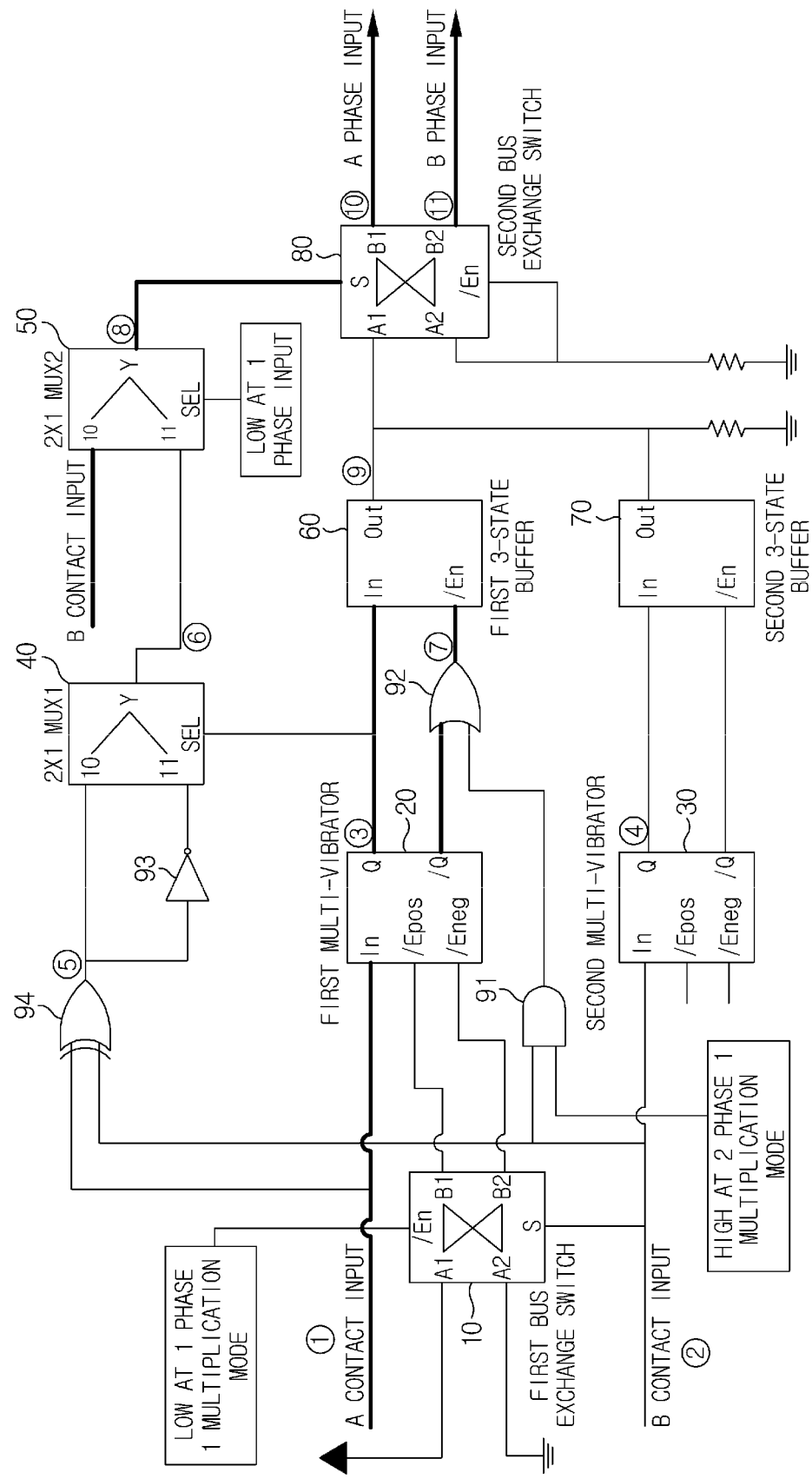
FIG. 8A is a configurative block diagram illustrating an operation of a circuit of FIG. 6 at a multiplication mode of 1-phase/2-input/2-multiplication according to an exemplary embodiment of the present disclosure.
Figure 8B:
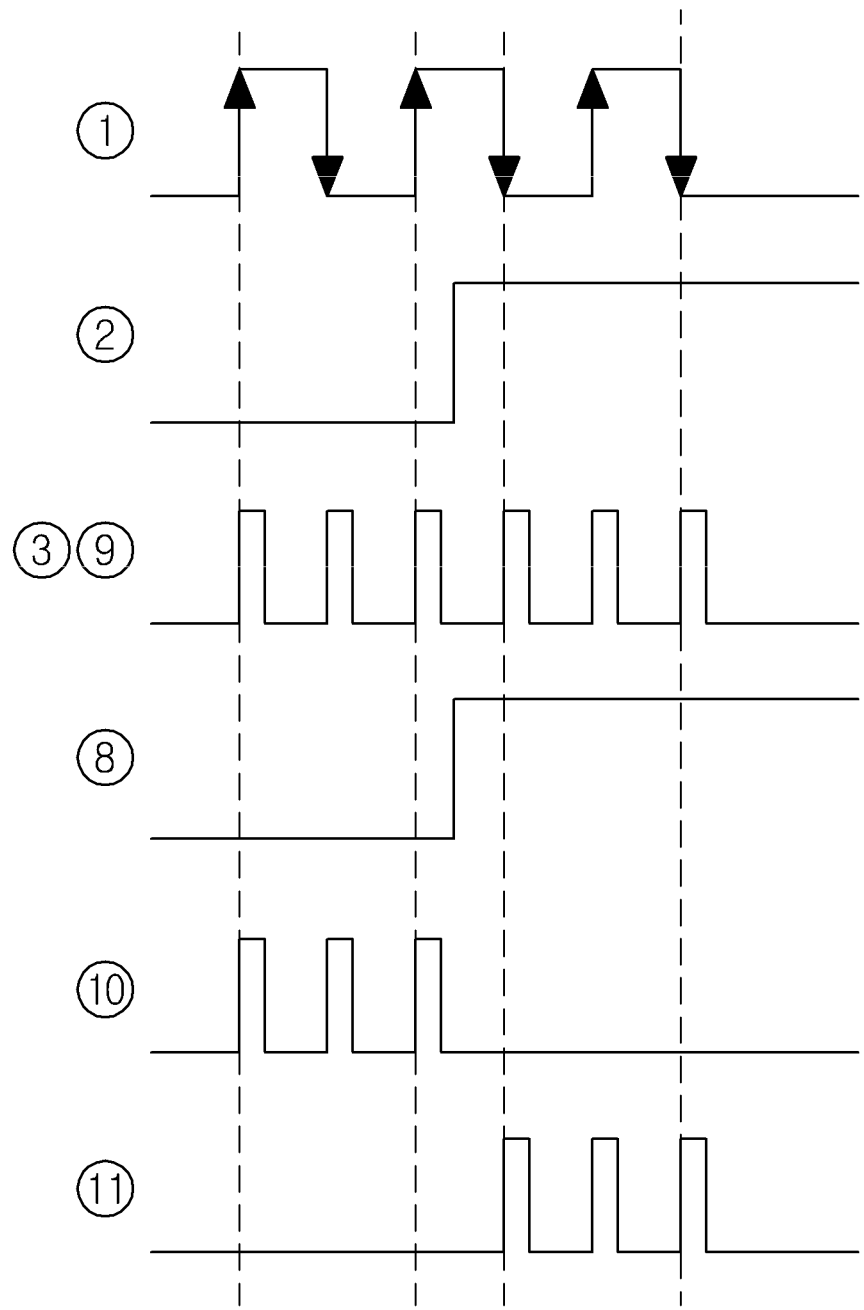
FIG. 8B is a timing view of each point of FIG. 8A according to an exemplary embodiment of the present disclosure.

FIG. 8A is a configurative block diagram illustrating an operation of a circuit of FIG. 6 at a multiplication mode of 1-phase/2-input/2-multiplication according to an exemplary embodiment of the present disclosure, and FIG. 8B is a timing view of each point of FIG. 8A according to an exemplary embodiment of the present disclosure.

Referring to FIG. 8A and FIG. 8B, in case of 1-phase/2-input/2-multiplication mode, both the rising edge and falling edge of the A contact input must be counted, such that the first multi-vibrator (20) receives LOW from the MPU (not shown) as a control input to generate pulse of ③ by generating a pulse of both the rising edge and falling edge of the A contact input.

At this time, a control signal inputted to the /En terminal of the first 3-state buffer (60) is a signal from the /Q terminal (i.e., an inversion signal of output from the Q terminal) of the first multi-vibrator (20), such that the output (pulse of ⑨) of the first 3-state buffer (60) is same as the pulse of ③.

A control signal of the second bus exchange switch (80) is the B contact input, such that in a case the B contact input is LOW (pulse of being LOW), the pulse of ⑨ is outputted as the A phase input, and in a case the B contact input is HIGH (pulse of ⑧ being HIGH), the pulse of ⑨ is outputted as the B phase input. Thus, it can be noted that a condition of 1-phase/2-input/2-multiplication mode is satisfied.

Figure 9A:
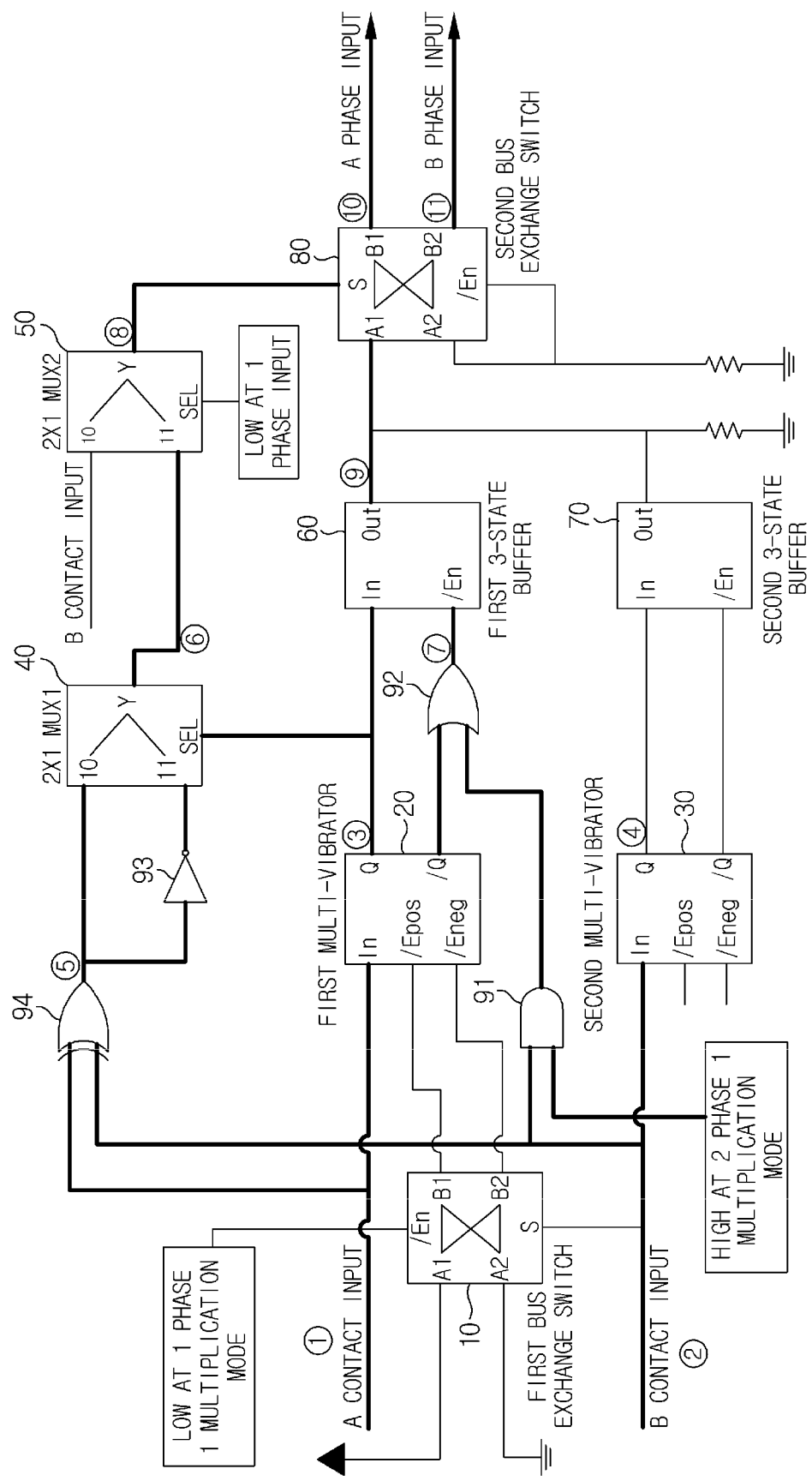
FIG. 9A is a configurative block diagram illustrating an operation of a circuit of FIG. 6 at a multiplication mode of 2-phase/1-multiplication according to an exemplary embodiment of the present disclosure.
Figure 9B:
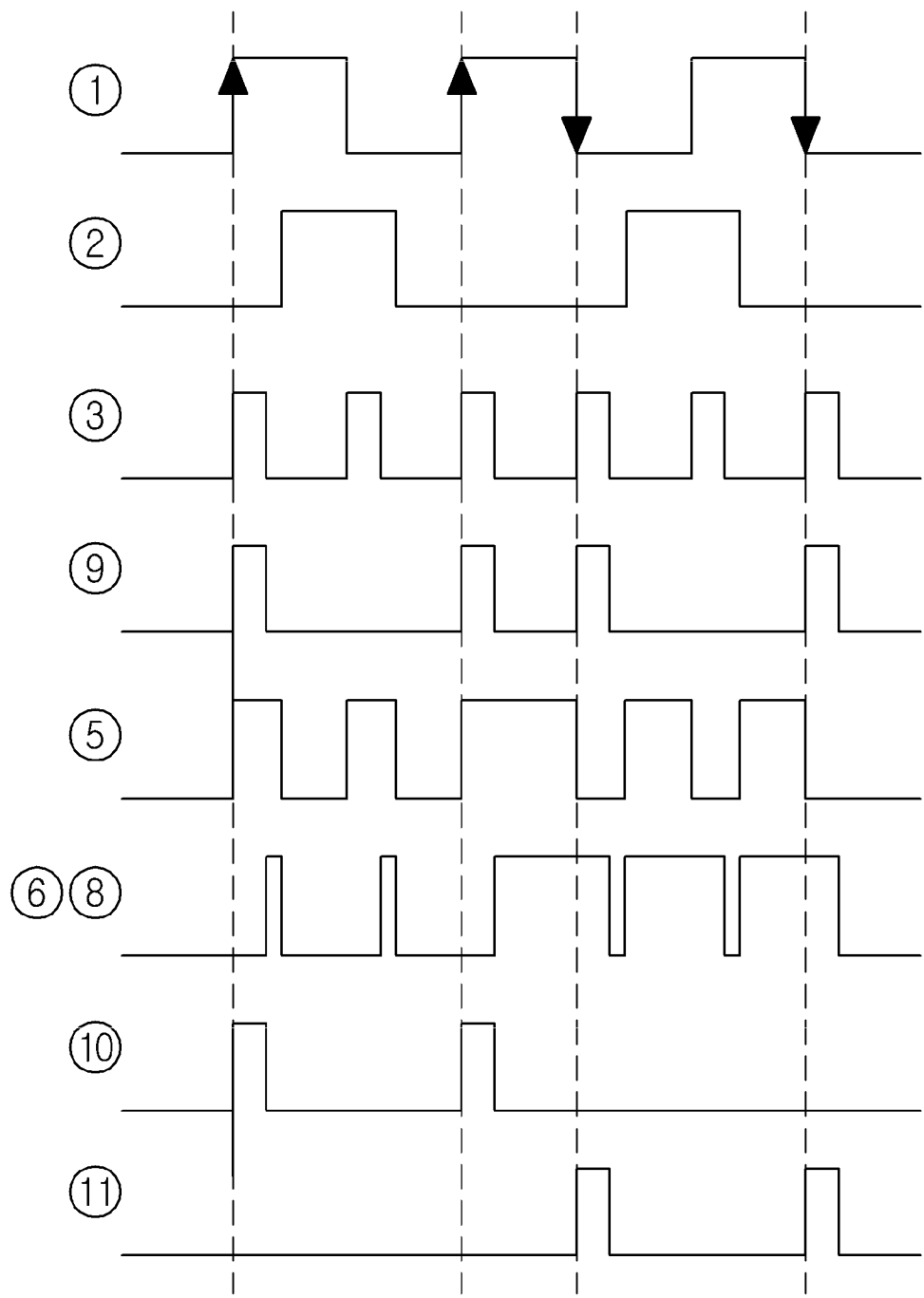
FIG. 9B is a timing view of each point of FIG. 9A according to an exemplary embodiment of the present disclosure.

FIG. 9A is a configurative block diagram illustrating an operation of a circuit of FIG. 6 at a multiplication mode of 2-phase/1-multiplication according to an exemplary embodiment of the present disclosure, and FIG. 9B is a timing view of each point of FIG. 9A according to an exemplary embodiment of the present disclosure.

In case of 2-phase/1-multiplication mode, a phase difference between the A contact input and the B contact input is distinguished to separate addition from deduction.

The first multi-vibrator (20) generates a pulse of both the rising and falling edges to generate pulse of ③. In 2-phase/ 1-multiplication, the counting operation is performed only if the B contact input is LOW, such that a control signal inputted to the /En terminal of the first 3-state buffer (60) is a signal from the /Q terminal (i.e., an inversion signal of output from the Q terminal) of the first multi-vibrator (20), such that pulse of ⑨ same as the pulse of ③ is outputted.

In a case an input to the SEL terminal of the first MUX (40) is LOW, an input to the I1 terminal is outputted, and in a case an input to the SEL terminal is HIGH, an input to the I1 terminal is outputted. The signal to the SEL terminal of the first MUX (40) is an output of the first multi-vibrator (20), such that in a case pulse of ② is LOW, an EX-OR (pulse of ⑤) of the A contact input and the B contact input is outputted, and in a case the pulse of ③ is HIGH, an inversion signal of EX-OR of the A contact input and B contact input is outputted.

The control signal of the second MUX (50) is set at HIGH to generate pulse of ⑧ that is same as pulse of ⑥. The pulse of ⑨ is outputted as the A phase input, in a case pulse of is LOW, and in a case pulse of is HIGH, the pulse of ⑨ is outputted as the B phase input. Thus, it can be noted that a condition of 2-phase/1-multiplication mode is satisfied.

Figure 10A:
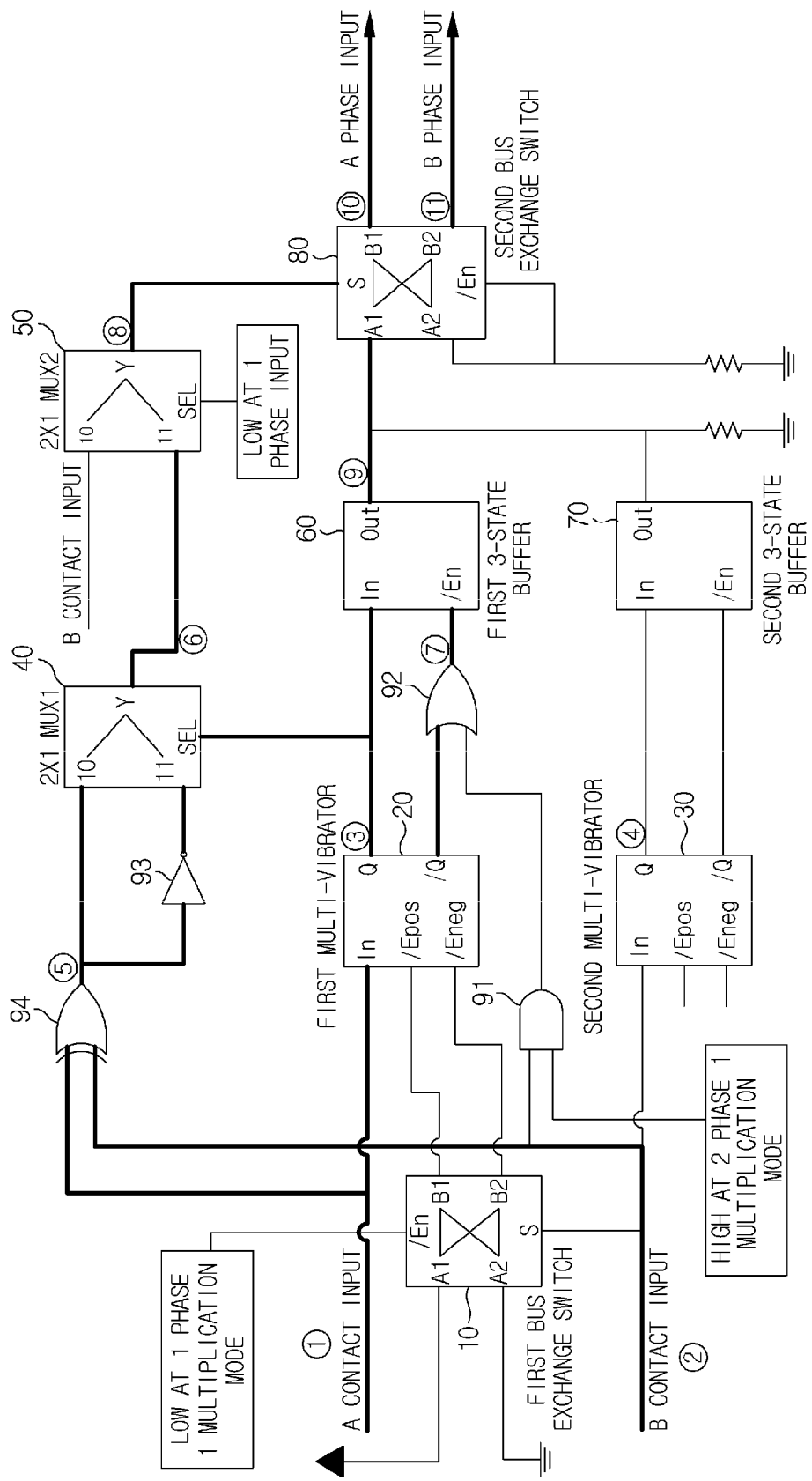
FIG. 10A is a configurative block diagram illustrating an operation of a circuit of FIG. 6 at a multiplication mode of 2-phase/2-multiplication according to an exemplary embodiment of the present disclosure.
Figure 10B:
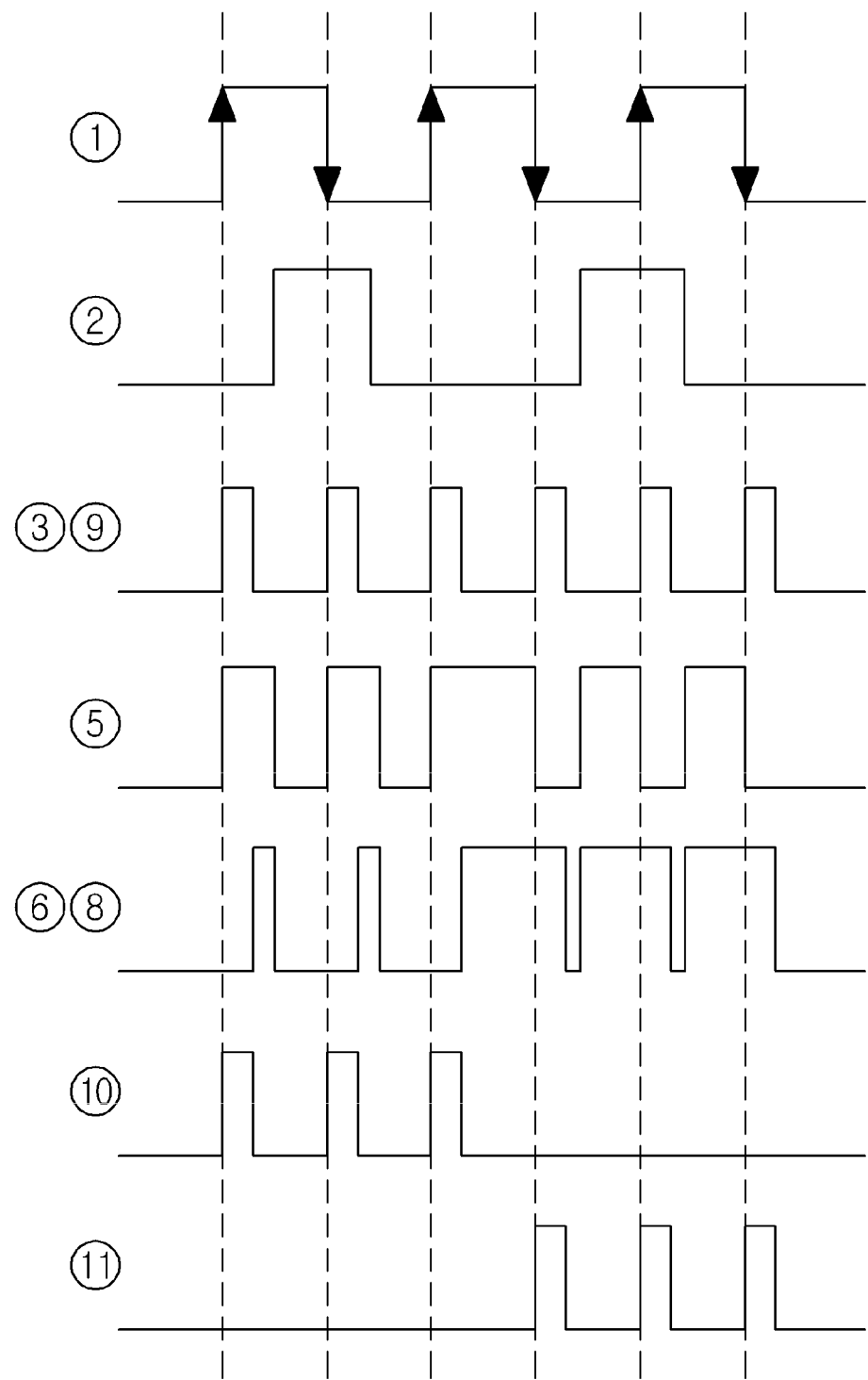
FIG. 10B is a timing view of each point of FIG. 10A according to an exemplary embodiment of the present disclosure.

FIG. 10A is a configurative block diagram illustrating an operation of a circuit of FIG. 6 at a multiplication mode of 2-phase/2-multiplication according to an exemplary embodiment of the present disclosure, and FIG. 10B is a timing view of each point of FIG. 10A according to an exemplary embodiment of the present disclosure.

In case of 2-phase/2-multiplication mode, a phase difference between the A contact input and the B contact input is distinguished to separate addition from deduction.

The first multi-vibrator (20) generates a pulse of both the rising and falling edges to generate pulse of ③. In 2-phase/2-multiplication mode, the counting operation is performed for both rising/falling edges of the A contact input, such that a control signal inputted to the /En terminal of the first 3-state buffer (60) uses an output of the first multi-vibrator (20), where pulse of ⑨ is same as the pulse of ③.

In a case a control signal inputted to the SEL terminal is LOW, the first MUX (40) outputs an input of the I0 terminal, and in a case a control signal inputted to the SEL terminal is HIGH, the first MUX (40) outputs an input of the I1 terminal. The control signal inputted to the SEL terminal of the first MUX (40) is an output of the first multi-vibrator (20), such that, in a case the pulse of ③ is LOW, an EX-OR (pulse of ⑤) of the A contact input and the B contact input is outputted, and in a case the pulse of ③ is HIGH, an inversion signal of EX-OR of the A contact input and the B contact input is outputted.

The control signal inputted to the SEL terminal of the second MUX (50) is set at HIGH to generate pulse of ⑧ that is same as pulse of ⑥. The pulse of ⑨ is outputted as the A phase input, in a case pulse of is LOW, and in a case the pulse of ⑧ is HIGH, the pulse of ⑨ is outputted as the B phase input. Thus, it can be noted that a condition of 2-phase/2-multiplication mode is satisfied.

Figure 11A:
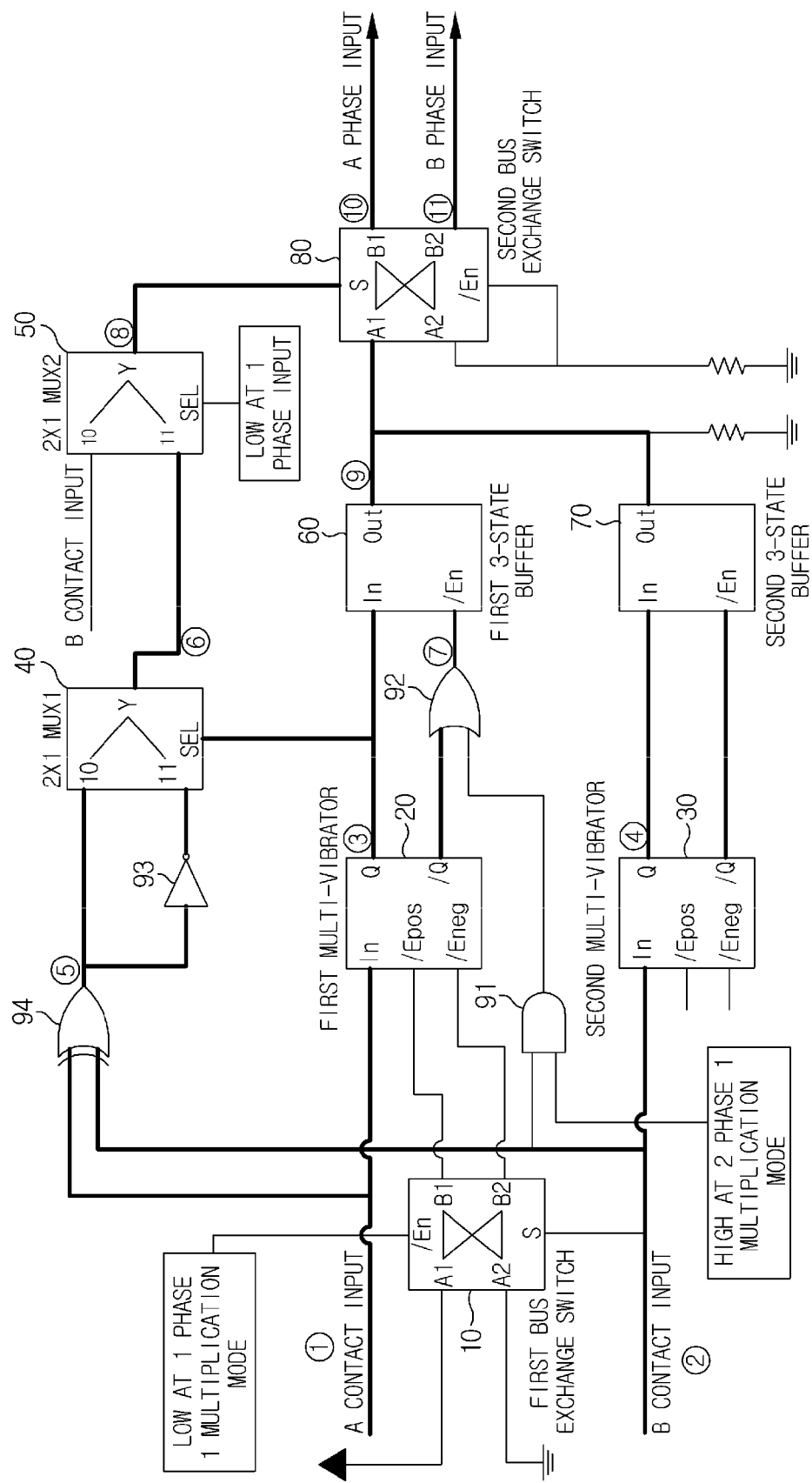
FIG. 11A is a configurative block diagram illustrating an operation of a circuit of FIG. 6 at a multiplication mode of 2-phase/4-multiplication according to an exemplary embodiment of the present disclosure.
Figure 11B:
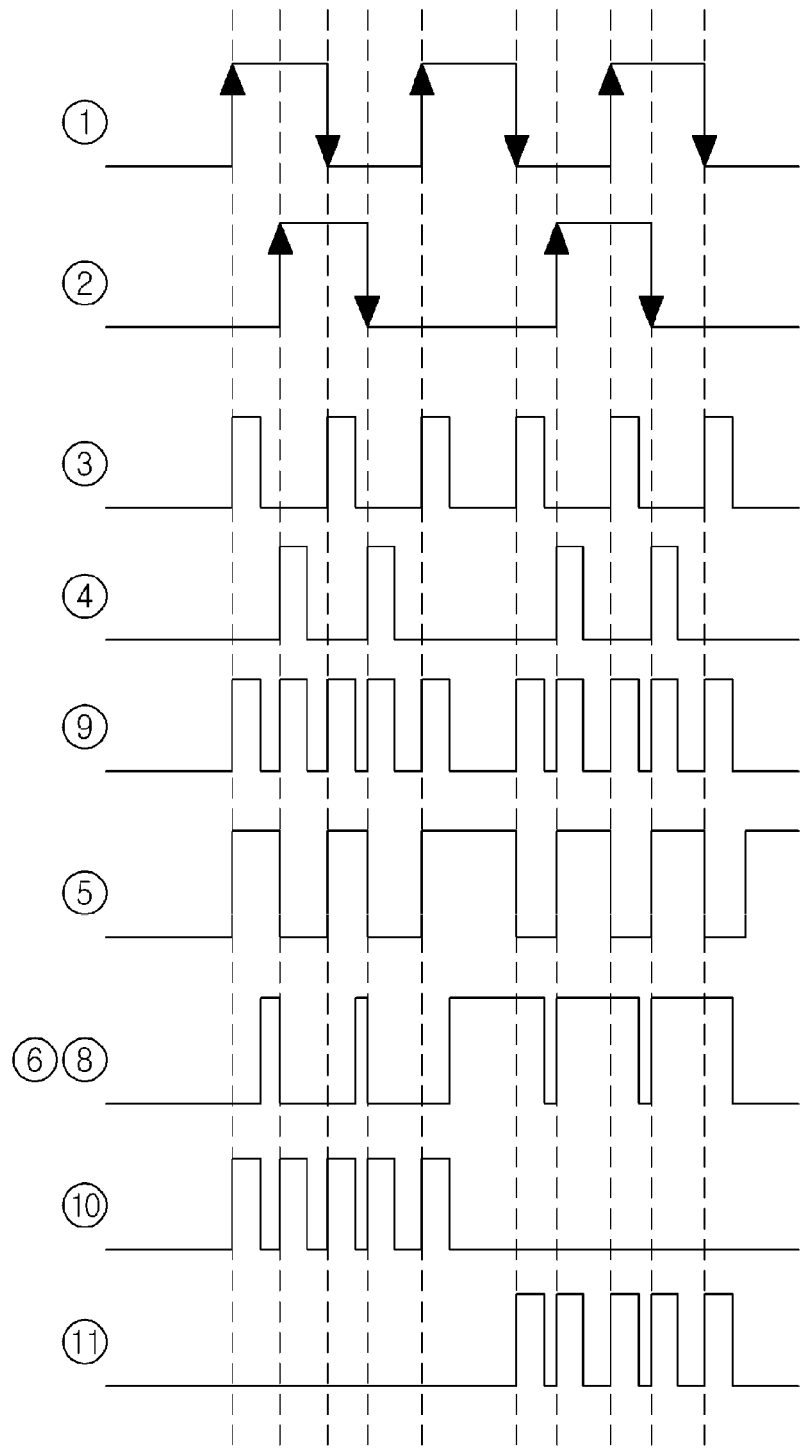
FIG. 11B is a timing view of each point of FIG. 11A according to an exemplary embodiment of the present disclosure.

FIG. 11A is a configurative block diagram illustrating an operation of a circuit of FIG. 6 at a multiplication mode of 2-phase/4-multiplication according to an exemplary embodiment of the present disclosure, and FIG. 11B is a timing view of each point of FIG. 11A according to an exemplary embodiment of the present disclosure.

In the 2-phase/4-multiplication mode, a counting operation is performed at both the rising and falling edges of the A contact input and the B contact input, and a phase difference between two input signals separates the addition from deduction. The first and second multi-vibrators (20, 30) are made to output a pulse of both rising and falling edges of input to generate pulse of ⑨.

In a case a control signal inputted to the SEL terminal is LOW, the first MUX (40) outputs an input to the I0 terminal, and in a case a control signal inputted to the SEL terminal is HIGH, the first MUX (40) outputs an input to the I1 terminal. The control signal inputted to the SEL terminal of the first MUX (40) is an output of the first multi-vibrator (20), such that, in a case pulse of ③ is LOW, an EX-OR (pulse of ⑤) of the A contact input and the B contact input is outputted, and in a case the pulse of ③ is HIGH, an inversion signal of EX-OR of the A contact input and the B contact input is outputted.

The control signal inputted to the SEL terminal of the second MUX (50) is set at HIGH to generate pulse of ⑧ that is same as pulse of ⑥. The pulse of ⑨ is outputted as the A phase input, in a case the pulse of ⑧ is LOW, and in a case the pulse of ⑧ is HIGH, the pulse of ⑨ is outputted as the B phase input. Thus, it can be noted that a condition of 2-phase/4-multiplication mode is satisfied.

Figure 12A:
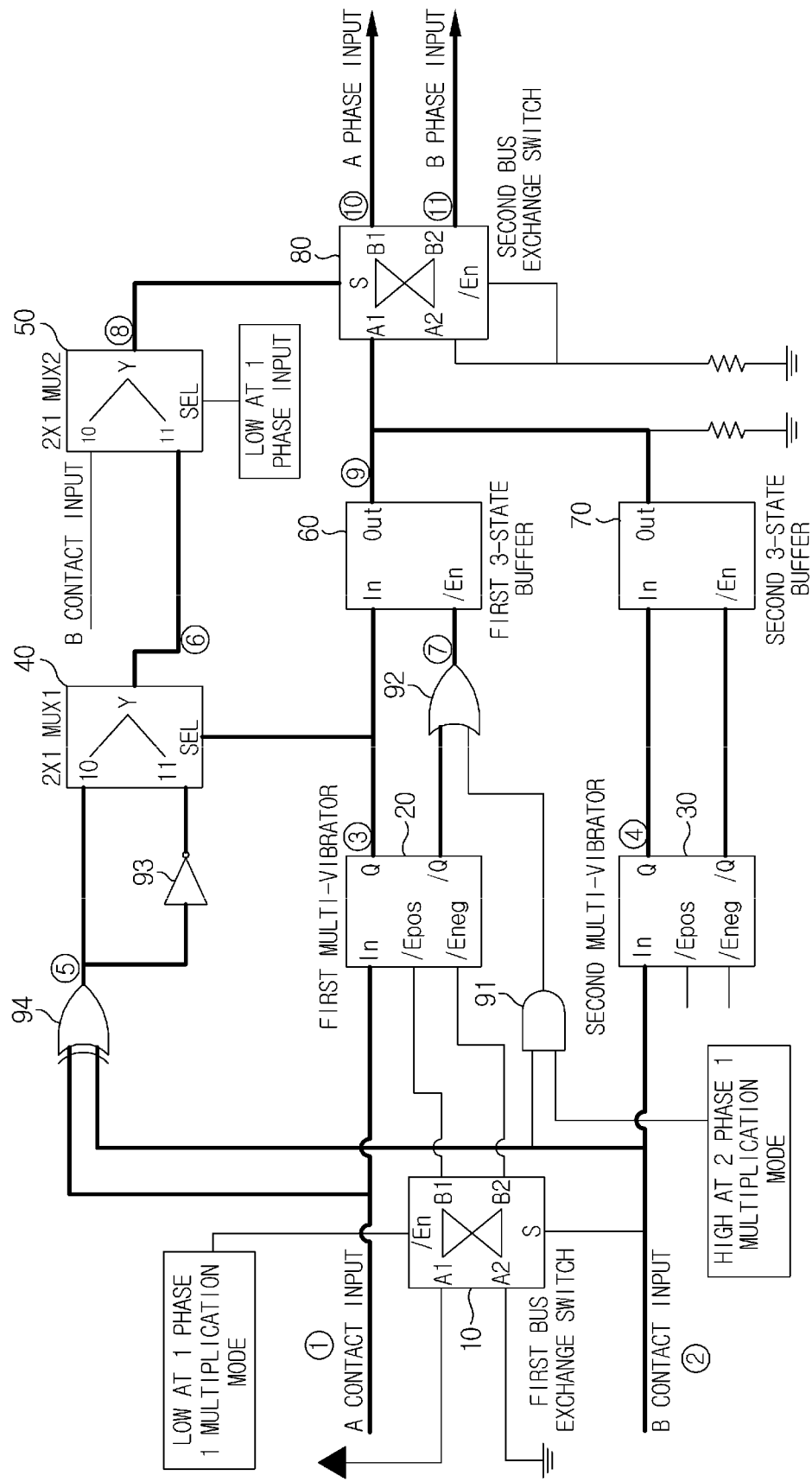
FIG. 12A is a configurative block diagram illustrating an operation of a circuit of FIG. 6 at a CW/CCW mode according to an exemplary embodiment of the present disclosure.
Figure 12B:
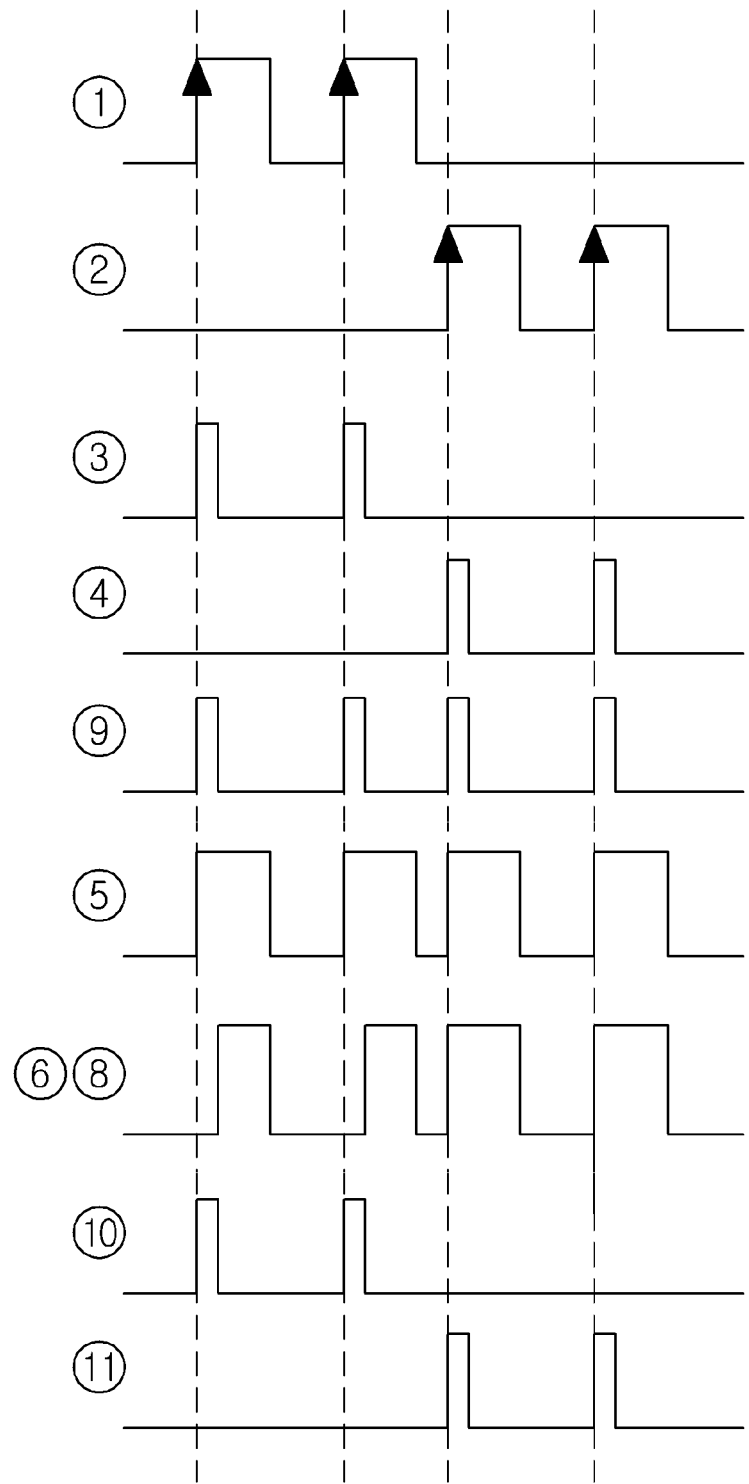
FIG. 12B is a timing view of each point of FIG. 12A according to an exemplary embodiment of the present disclosure.

FIG. 12A is a configurative block diagram illustrating an operation of a circuit of FIG. 6 at a CW/CCW mode according to an exemplary embodiment of the present disclosure, and FIG. 12B is a timing view of each point of FIG. 12A according to an exemplary embodiment of the present disclosure.

The CW/CCW mode detects a rising edge of the A contact input and the B contact input to perform the counting operation. The first and second multi-vibrators (20, 30) generate pulse of ⑨ by generating a pulse of rising edge of input.

In a case a control signal inputted to the SEL terminal is LOW, the first MUX (40) outputs an input to the I0 terminal, and in a case a control signal inputted to the SEL terminal is HIGH, the first MUX (40) outputs an input to the I1 terminal. The control signal inputted to the SEL terminal of the first MUX (40) is an output of the first multi-vibrator (20), such that, in a case pulse of OO is LOW, an EX-OR (pulse of ⑤) of the A contact input and the B contact input is outputted, and in a case the pulse of ③ is HIGH, an inversion signal of EX-OR of the A contact input and the B contact input is outputted.

The control signal of the second MUX (50) is set at HIGH to generate pulse of ⑧ that is same as pulse of ⑥. The pulse of ⑨ is outputted as the A phase input, in a case pulse of ⑧ is LOW, and in a case the pulse of ⑧ is HIGH, the pulse of ⑨ is outputted as the B phase input. Thus, it can be noted that a condition of CW/CCW is satisfied.

In the conventional input circuit in high speed counter module for PLC, if a pulse of high frequency is counted using 2-phase/4-multiplication having a relatively high number of multiplication frequency, firmware is burdened, and this burden can adversely affect reliability and performance of a product.

The present disclosure can simplify an input signal in CW/CCW mode to dispense with requirement of checking of multiplication mode in an interrupt routine of firmware and addition/deduction states to thereby reduce interrupt process time.

The present disclosure allows a time used for interrupt process in the conventional input circuit to be used in processing other tasks to thereby enhance product performance and to count a pulse of a higher frequency.

The above-mentioned input circuit in high speed counter module for PLC according to the present disclosure may, however, be embodied in many different forms and should not be construed as limited to the embodiments set forth herein. Thus, it is intended that embodiments of the present disclosure may cover the modifications and variations of this disclosure provided they come within the scope of the appended claims and their equivalents.

While particular features or aspects may have been disclosed with respect to several embodiments, such features or aspects may be selectively combined with one or more other features and/or aspects of other embodiments as may be desired.

What is claimed is:

1. An input circuit in high speed counter module for programmable logic controller (PLC) configured to input a pulse to an micro-processor unit (MPU), the input circuit comprising: a first multi-vibrator generating a pulse by detecting rising and falling edges of a first contact input; a second multi-vibrator generating a pulse by detecting rising and falling edges of a second contact input; a first buffer outputting an output of the first multi-vibrator in 3-state; a second buffer outputting an output of the second multi-vibrator in 3-state; a first multiplexer (MUX) outputting any one of an EX-OR signal of the first and second contact inputs and a reverse signal of the EX-OR signal; a second MUX outputting any one of an output of the first MUX and the second contact input; and a first switch outputting outputs of the first and second buffers as a first phase input or a second phase input.

2. The input circuit of claim 1, wherein the first and second contact inputs are any one signal of a 1-phase/2-input/1-multiplication mode, a 1-phase/2-input/2-multiplication mode, a 2-phase/1-multiplication mode, a 2-phase/2-multiplication mode, a 2-phase/4-multiplication mode, and a CW/CCW mode.

3. The input circuit of claim 1, further comprising a second switch that switches by receiving LOW and HIGH signals.

4. The input circuit of claim 3, wherein the second switch receives the second contact input as a selection signal, and receives a 'LOW at a 1-phase/1-multiplication' as a control signal.

5. The input circuit of claim 4, wherein the first multi-vibrator receives an output of the second switch as a control signal.

6. The input circuit of claim 1, wherein the first and second multi-vibrators receive a control signal from the MPU.

7. The input circuit of claim 1, wherein the first buffer receives ORs (logical sums) of a first output and a second output as a control signal, the first output being AND (logical product) of the second contact input and a 'HIGH at 2-phase/1-multiplication' and the second output being a reversal of an output of the first multi-vibrator.

8. The input circuit of claim 1, wherein the second buffer receives a reversal of an output of the second multi-vibrator as a control signal.

9. The input circuit of claim 1, wherein the first MUX receives an output of the first multi-vibrator as a control signal.

10. The input circuit of claim 1, wherein the second MUX receives 'LOW at 1-phase input' as a control signal.

11. The input circuit of claim 1, wherein the first switch receives an output of the second MUX as a selection signal.

* * * * *